United States Patent
Falck et al.

(10) Patent No.: US 9,293,524 B2
(45) Date of Patent: Mar. 22, 2016

(54) SEMICONDUCTOR DEVICE WITH A FIELD RING EDGE TERMINATION STRUCTURE AND A SEPARATION TRENCH ARRANGED BETWEEN DIFFERENT FIELD RINGS

(71) Applicant: Infineon Technologies AG, Neubiberg (DE)

(72) Inventors: Elmar Falck, Hohenbrunn (DE); Wolfgang Roesener, Ottobrunn (DE); Hans Peter Felsl, Munich (DE); Andre Stegner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/268,033

(22) Filed: May 2, 2014

(65) Prior Publication Data

US 2015/0318347 A1   Nov. 5, 2015

(51) Int. Cl.
| | |
|---|---|
| *H01L 29/66* | (2006.01) |
| *H01L 29/06* | (2006.01) |
| *H01L 29/78* | (2006.01) |
| *H01L 29/778* | (2006.01) |
| *H01L 29/74* | (2006.01) |
| *H01L 29/739* | (2006.01) |
| *H01L 21/761* | (2006.01) |

(52) U.S. Cl.
CPC .......... *H01L 29/0623* (2013.01); *H01L 21/761* (2013.01); *H01L 29/7393* (2013.01); *H01L 29/74* (2013.01); *H01L 29/778* (2013.01); *H01L 29/78* (2013.01)

(58) Field of Classification Search
CPC ............ H01L 29/0615; H01L 29/0619; H01L 29/0634; H01L 29/7811; H01L 29/7823; H01L 29/0623; H01L 29/7393
USPC .................................................. 257/192, 194
See application file for complete search history.

(56) References Cited

U.S. PATENT DOCUMENTS

| | | | | |
|---|---|---|---|---|
| 5,233,215 | A * | 8/1993 | Baliga ........................... | 257/490 |
| 5,430,324 | A * | 7/1995 | Bencuya ....................... | 257/495 |
| 6,674,138 | B1 * | 1/2004 | Halliyal et al. ............... | 257/411 |
| 2007/0080422 | A1 | 4/2007 | Falck et al. | |
| 2012/0187473 | A1 * | 7/2012 | Zeng et al. .................... | 257/329 |
| 2014/0070229 | A1 * | 3/2014 | Stum et al. ...................... | 257/77 |

FOREIGN PATENT DOCUMENTS

DE     102005047102 B3     5/2007

* cited by examiner

*Primary Examiner* — Tu-Tu Ho
(74) *Attorney, Agent, or Firm* — Murphy, Bilak & Homiller, PLLC

(57) ABSTRACT

A semiconductor device has a semiconductor body with bottom and top sides and a lateral surface. An active semiconductor region is formed in the semiconductor body and an edge region surrounds the active semiconductor region. A first semiconductor zone of a first conduction type is formed in the edge region. An edge termination structure having at least N field limiting structures is formed in the edge region. Each of the field limiting structures has a field ring and a separation trench formed in the semiconductor body, where N is at least 1. Each of the field rings has a second conduction type, forms a pn-junction with the first semiconductor zone and surrounds the active semiconductor region. For each of the field limiting structures, the separation trench of that field limiting structure is arranged between the field ring of that field limiting structure and the active semiconductor region.

24 Claims, 9 Drawing Sheets

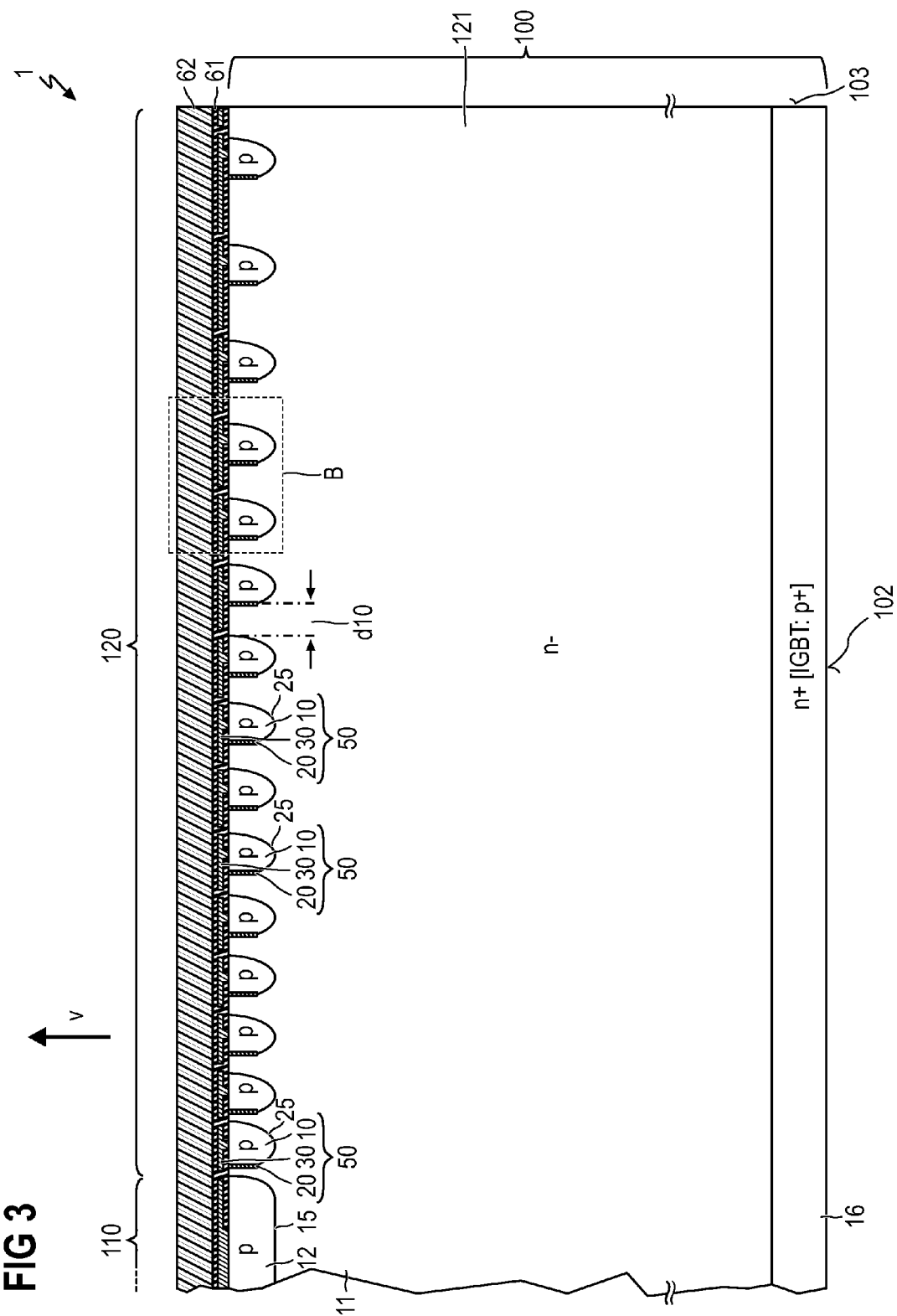

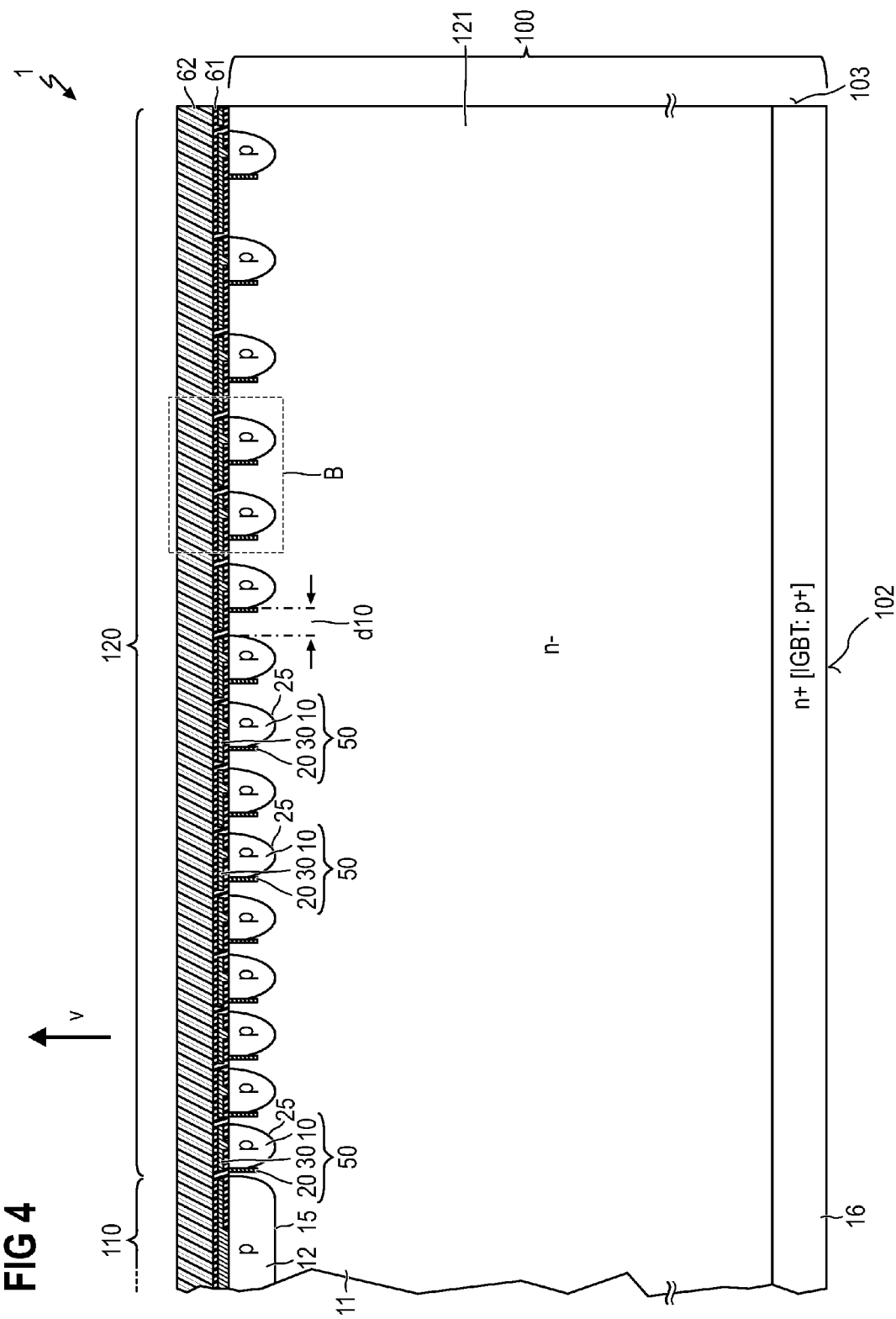

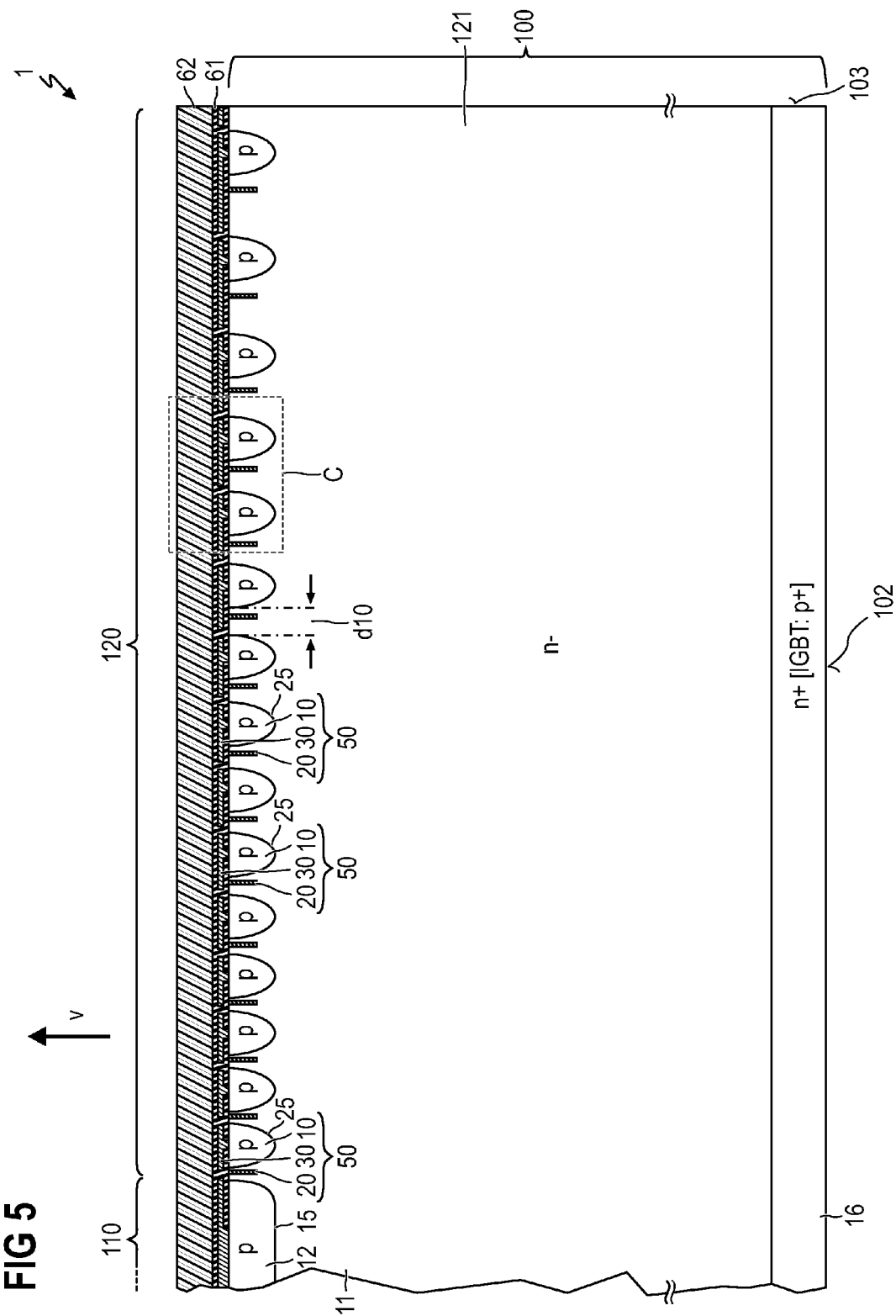

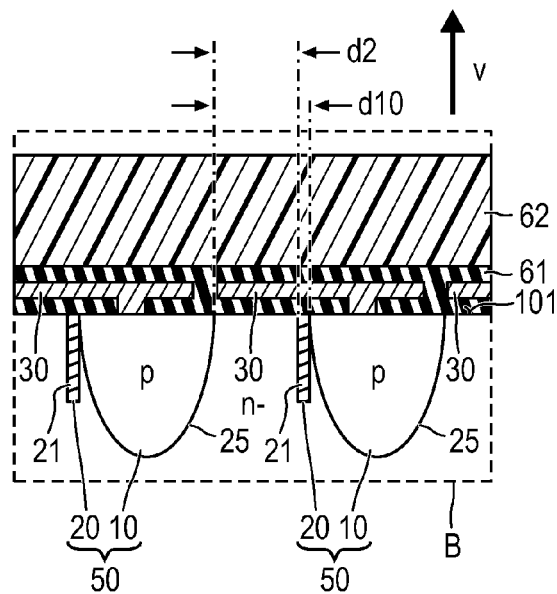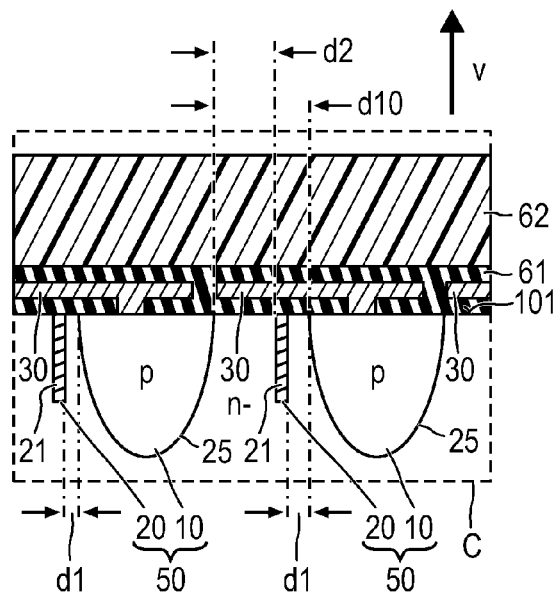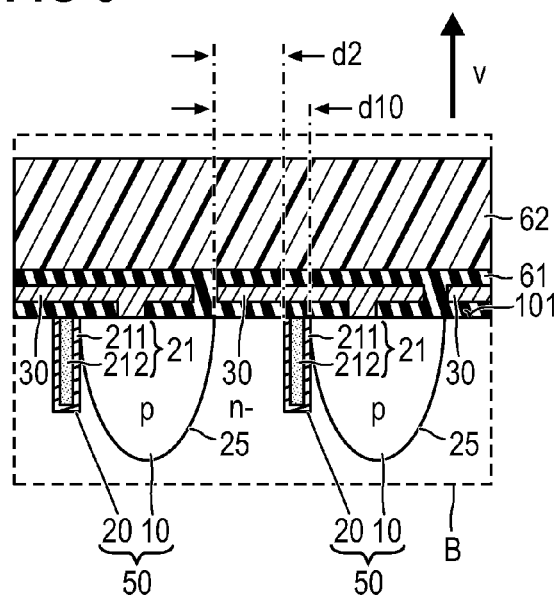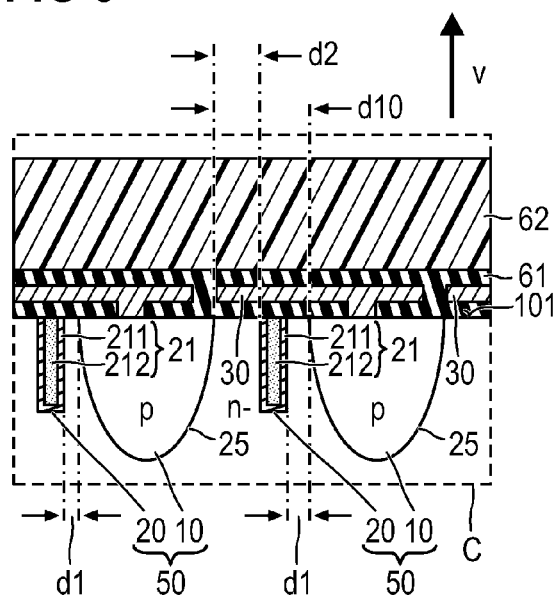

SEMICONDUCTOR DEVICE WITH A FIELD RING EDGE TERMINATION STRUCTURE AND A SEPARATION TRENCH ARRANGED BETWEEN DIFFERENT FIELD RINGS

TECHNICAL FIELD

Embodiments of the present invention relate to a semiconductor device with a field ring edge termination structure.

BACKGROUND

Power semiconductor devices, such as power diodes, power MOSFETs, power IGBTs, or any other power semiconductor devices are designed to withstand high blocking voltages, e.g. at least 600 V. Those power devices include a pn-junction that is formed between a p-doped semiconductor region and an n-doped semiconductor region. The device is in blocking mode when the pn-junction is reverse biased. In this case a space charge region is built up in the p-doped and n-doped regions. Usually, one of these n-doped and p-doped semiconductor regions is more lightly doped than the other one of these semiconductor regions, so that the depletion region mainly extends in the more lightly doped region, which mainly supports the voltage applied across the pn-junction.

The ability of a pn-junction to support high voltages is mainly limited by impact ionization of the power semiconductor device. As a blocking voltage applied to a pn-junction increases, an electric field in the space charge region of the semiconductor device also increases. The electric field results in an acceleration of mobile charge carriers present in the semiconductor region. If a charge carrier has got enough energy from the electric field, it can create electron-hole pairs by impact ionization. Such secondary created charge carriers created by impact ionization can create new charge carriers, and so on, resulting in a multiplication effect. At the onset of an avalanche breakdown, a significant current flows across the pn-junction in the reverse direction. The voltage at which the avalanche breakdown sets in is referred to as breakdown voltage.

The electric field at which the avalanche breakdown sets in is referred to as critical electric field ($E_{crit}$). The absolute value of the critical electric field is mainly dependent on the type of semiconductor material used for forming the pn-junction, and is also dependent on the doping concentration of the more lightly doped semiconductor region.

The critical electric field is defined for a semiconductor region that has an infinite size in directions perpendicular to field strength vectors of the electric field. Power semiconductor devices, however, have a semiconductor body of finite size that is terminated by edge surfaces in lateral directions. In vertical power semiconductor devices, which are semiconductor devices in which the pn-junction mainly extends substantially in a horizontal plane of the semiconductor body, the pn-junction usually does not extend to the edge surface of the semiconductor body but is distant to the edge surface of the semiconductor body in a lateral direction. In this case, a semiconductor region (edge region) of the semiconductor body adjoining the pn junction in the lateral direction also has to withstand the blocking voltage.

In the edge region, an edge termination structure can be implemented to improve the voltage blocking capability in the edge region. Different types of edge termination structures are known. One of those edge termination structures includes a number of doped field rings that surround the semiconductor region with the pn junction. However, such field rings are arranged consecutively and distant from one another and therefore require a lot of space. Hence, there is a need for an improved semiconductor device.

SUMMARY

According to one aspect of the invention, a semiconductor device has a semiconductor body with an active semiconductor region formed therein. The semiconductor body further has a bottom side, a top side opposite the bottom side, and a lateral surface. Also formed in the semiconductor body is an edge region that surrounds the active semiconductor region. A first semiconductor zone of a first conduction type is formed in the edge region. In the edge region, an edge termination structure is formed. The edge termination structure has at least N field limiting structures each of which comprises a separation trench formed in the semiconductor body, and a field ring. N is a positive integer with $N \geq 1$. Each of the field rings has a second conduction type complementary to the first conduction type and forms a pn-junction with the first semiconductor zone. Each of the field rings surrounds the active semiconductor region. For each of the field limiting structures, the separation trench of that field limiting structure is arranged between the field ring of that field limiting structure and the active semiconductor region.

Compared with a similar conventional semiconductor device that has substantially the same structure, the same voltage blocking capability, but no separation trenches arranged between adjacent field rings, the field rings of the device of the invention can be arranged at lower distances because the separation trenches at least partly interrupt the charge carrier channel between adjacent field rings, which charge carrier channel can, e.g., be formed under the influence of surface charges. As a result, the isolation trenches serve to reduce the space required for the field ring structure.

A further aspect relates to a method for producing a semiconductor device. The method includes providing a semiconductor body with a bottom side, a top side opposite the bottom side, and a lateral surface. An active semiconductor region is produced in the semiconductor body. Also produced is an edge region of the semiconductor device. The edge region surrounds the active semiconductor region and has a first semiconductor zone of a first conduction type. In the edge region at least N field limiting structures are produced such that each of the field limiting structures has a field ring and a separation trench both formed in the semiconductor body. Thereby, N is an integer with $N \geq 1$. Each of the field rings has a second conduction type opposite the first conduction type and forms a pn-junction with the first semiconductor zone. Each of the field rings surrounds the active semiconductor region. For each of the field limiting structures, the separation trench of that field limiting structure is arranged between the field ring of that field limiting structure and the active semiconductor region.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 3 illustrates a cross-sectional side view of a semiconductor device according to FIGS. 1A and 1B in a sectional plane E-E, wherein the pn-junctions of the field limiting structures terminate at the bottom of the separation trench of the respective field limiting structure.

FIG. 4 illustrates a cross-sectional side view of a semiconductor device according to FIGS. 1A and 1B in a sectional plane E-E, wherein the pn-junctions of the field limiting structures terminate at a side wall of the separation trench of the respective field limiting structure.

FIG. 5 illustrates a cross-sectional side view of a semiconductor device according to FIGS. 1A and 1B in a sectional plane E-E, wherein the isolation trenches are spaced distant from the field ring of the corresponding field limiting structure.

FIG. 6 illustrates an enlarged section B of the semiconductor device of FIG. 2, wherein the insulation trenches are filled with a dielectric.

FIG. 7 illustrates an enlarged section C of the semiconductor device of FIG. 5, wherein the insulation trenches are filled with a dielectric.

FIG. 8 illustrates an enlarged section B of the semiconductor device of FIG. 2, wherein the insulation trenches contain an electrically conductive material and are coated with a dielectric that electrically insulates the electrically conductive material from the semiconductor body.

FIG. 9 illustrates an enlarged section C of the semiconductor device of FIG. 5, wherein the insulation trenches contain an electrically conductive material and are coated with a dielectric that electrically insulates the electrically conductive material from the semiconductor body.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1A:
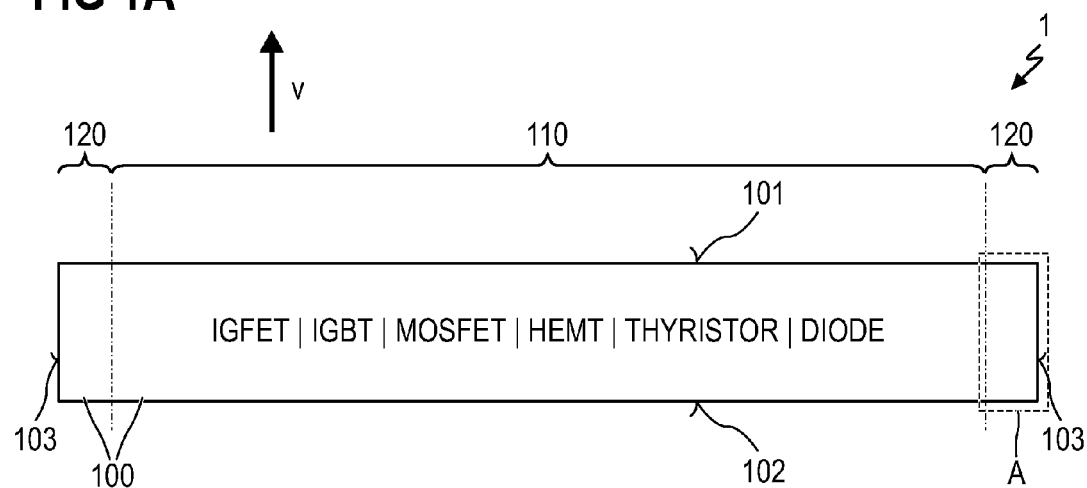
FIG. 1A schematically illustrates a side view of a semiconductor with an active semiconductor region and an edge region surrounding the semiconductor region.
Figure 1B:
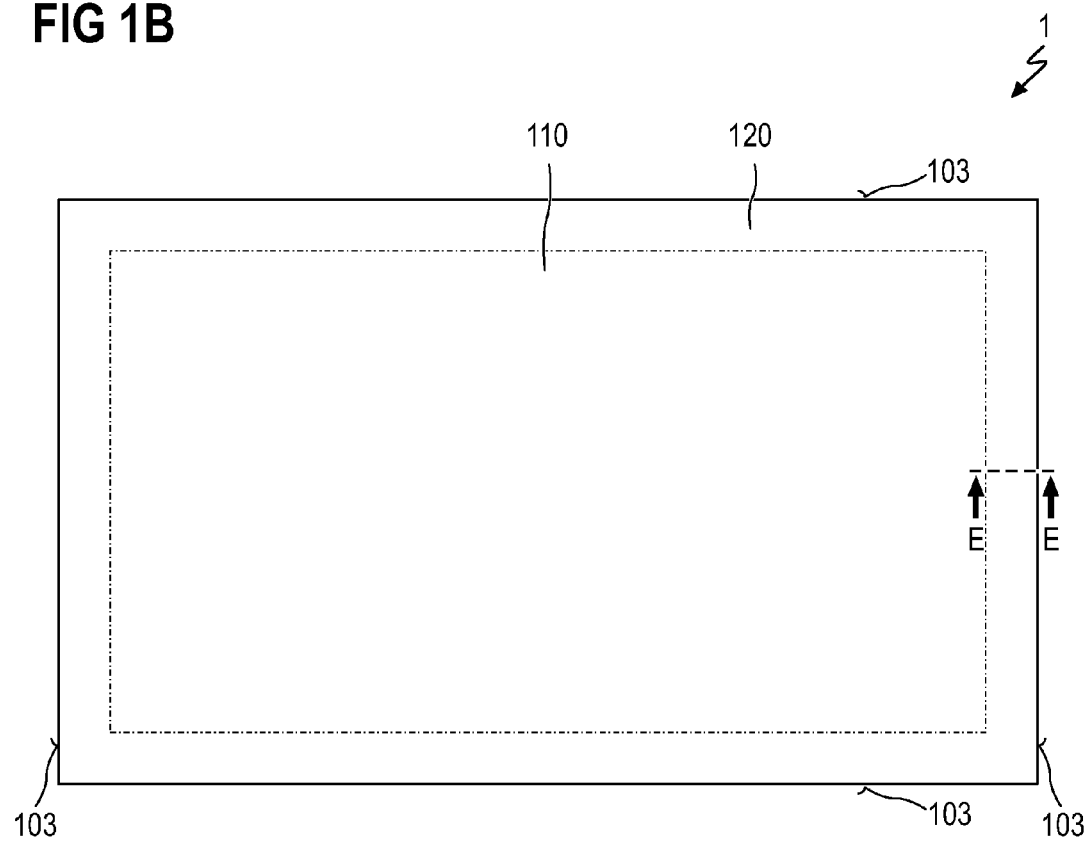
FIG. 1B schematically illustrates a top view of the semiconductor device of FIG. 1A.

FIGS. 1A and 1B schematically illustrate a semiconductor body 100 of a power semiconductor device 1. FIG. 1A is a side view and FIG. 1B a top view. The semiconductor body 100 has a top side 101, a bottom side 102 opposite the top side 101, and a lateral surface 103. The top side 101 is spaced distant from the bottom side 102 in a vertical direction v that runs perpendicular to the bottom side 102. For the sake of clearness, metallizations, electrodes, dielectric layers etc. arranged on the semiconductor body 100 are suppressed in FIGS. 1A and 1B and will be explained with reference to FIGS. 2 to 10B.

The semiconductor device 1 has an active semiconductor region 110, and an edge region 120 surrounding the active semiconductor region 110. The lateral surface 103 which may substantially extend perpendicular to the bottom side 102, is a closed ring surrounding both the active semiconductor region 110 and the edge region 120. That is, the edge region 120 is arranged between the active semiconductor region 110 and the lateral surface 103.

The semiconductor body 100 includes an arbitrary material, for instance a single-element semiconductor material, e.g. silicon (Si), germanium (Ge), or a compound semiconductor material, e.g. IV-IV or III-V or III-VI or II-VI or IV-VI or I-III-VI semiconductor material.

Suitable IV-IV semiconductor materials are SiC or SiGe. Suitable III-V semiconductor materials are GaP, GaAs, InP, InSb, InAs, GaSb, GaN, AlN, InN, $Al_xGa_{1-x}As$ ($0 \leq x \leq 1$) or $In_xGa_{1-x}N$ ($0 \leq x \leq 1$). Suitable II-VI semiconductor materials are ZnO, ZnS, ZnSe, ZnTe, CdS, CdSe, CdTe, $Hg_{1-x}Cd_xTe$ ($0 \leq x \leq 1$), BeSe, BeTe or HgS. Suitable III-VI semiconductor materials are GaS, GaSe, GaTe, InS, InSe, InTe. Suitable I-III-VI semiconductor materials are $CuInSe_2$, $CuInGaSe_2$, $CuInS_2$, CuIn, $GaS_2$. A suitable IV-VI semiconductor material is SnTe.

The semiconductor body 100 may have a substantially monocrystalline structure. However, the semiconductor body 100 may also have a small number of crystallographic defects like point defects, line defects, planar defects, bulk defects. In contrast, a body formed of polycrystalline semiconductor material, e.g. polycrystalline silicon, has a large number of crystallographic defects.

In order to realize an electronic structure monolithically integrated in the semiconductor body 100 and having an arbitrary function, the semiconductor body 100 may have any combination of doped and/or undoped crystalline semiconductor material, doped and/or undoped polycrystalline semiconductor material, p-conductive semiconductor regions, n-conductive semiconductor regions, trenches, metallization layers, dielectric layers, semiconductor resistance regions, pn-junctions and so on.

The semiconductor component 1 may also comprise arbitrary electrically conductive layers or elements like metal, polycrystalline semiconductor material, silicide as well as arbitrary dielectric layers or elements like nitride (e.g. silicon nitride), oxide (e.g. silicon oxide) or imide.

For instance, the electronic structure may consist of or include a transistor, e.g. a bipolar or an unipolar transistor like an IGFET (Insulated Gate Field Effect Transistor), e.g. a MOSFET (Metal Oxide Field Effect Transistor), an IGBT (Insulated Gate Bipolar Transistor), a JFET (Junction Field Effect Transistor), a HEMT (High Electron Mobility Transistor), a thyristor, a BJT (bipolar junction transistor), or a diode.

Figure 2:
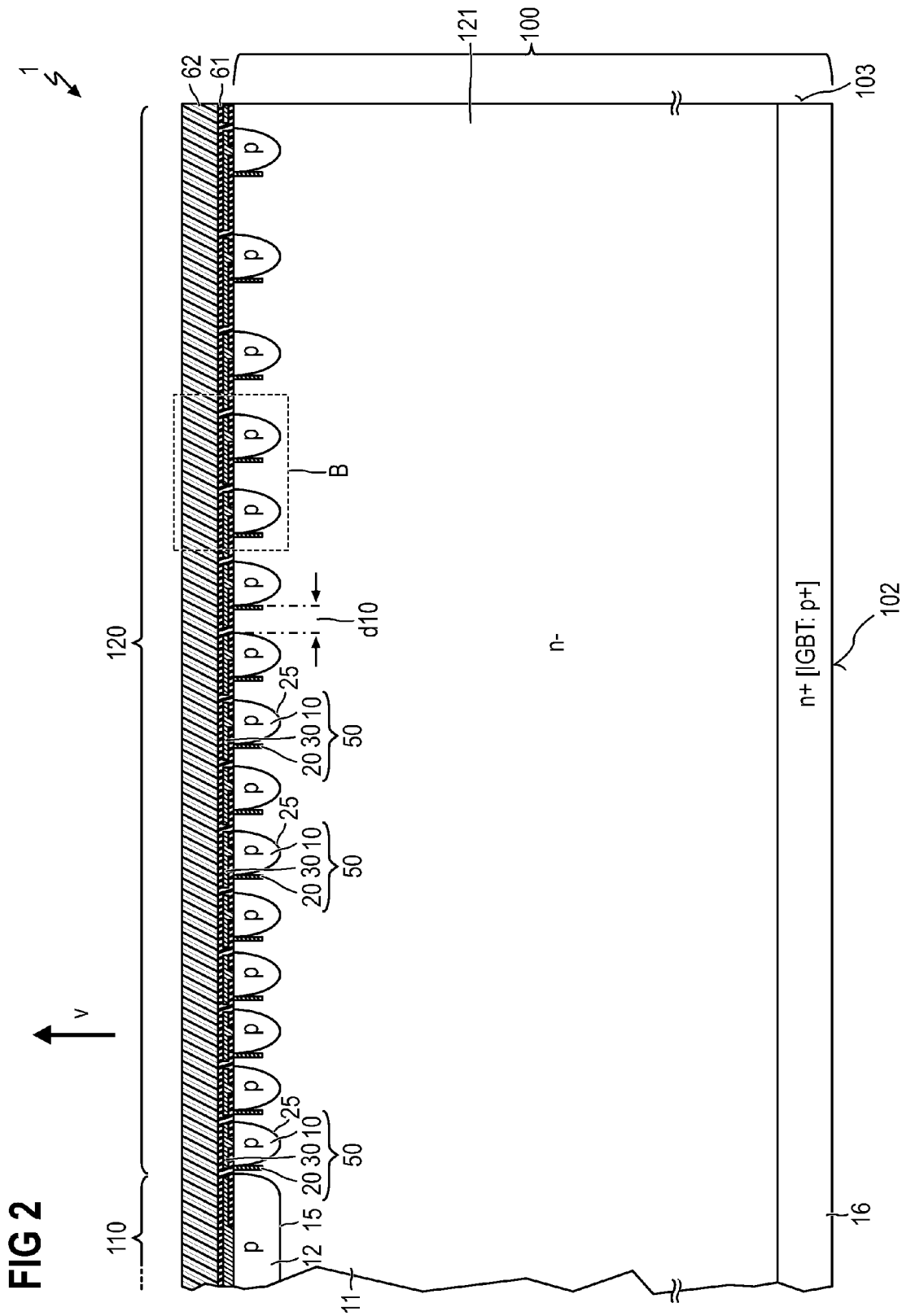
FIG. 2 illustrates a cross-sectional side view of a semiconductor device according to FIGS. 1A and 1B in a sectional plane E-E, wherein the isolation trenches directly adjoin to the field ring of the corresponding field limiting structure.

FIG. 2 is an enlarged cross-sectional view of a section of the semiconductor device of FIGS. 1A and 1B in a sectional plane E-E. The active semiconductor region 110 has a main pn-junction 15 formed between a first main semiconductor region 11 and a second main semiconductor region 12. The first main semiconductor region 11 and the second main semiconductor region 12 have complementary doping types. As illustrated in FIG. 2, the first main semiconductor region 11 may be of the n-type and the second main semiconductor region 12 of the p-type. However, the first main semiconductor region 11 may also be of the p-type and the second main semiconductor region 12 of the n-type.

As is also illustrated in the present embodiment, the first main semiconductor region 11 may comprise a drift zone of the semiconductor device 1. The doping concentration of the first main semiconductor region 11 is not required to be constant in the vertical direction v. For instance, the first main semiconductor region 11 may have at least one sub-region in which the doping concentration of the first main semiconductor region 11 has, in the vertical direction v, a local or even global maximum, whereby "global" refers to the whole first main semiconductor region 11. The local or global maximum may be spaced distant from the bottom side 102 or be located at the bottom side 102. For instance, such a sub-region may be a field stop zone or a contact region for improving an electrical contact to an electrode arranged on the semiconductor body 100.

As illustrated, the main pn-junction 15 may run substantially parallel to the bottom side 102. In principle however, the main pn-junction 15 may have an arbitrary shape. In any case, an edge termination structure arranged in the edge region 120 as will be explained in more detail below serves to improve the voltage blocking capability in the edge region 120 if the main pn-junction 15 is in its blocking state, that is, if the main pn-junction 15 is reverse biased by a blocking voltage. For instance, the blocking voltage may be at least 10 V or at least 100 V or at least 600 V or at least 1200 V or at least 3.3 kV. However, the blocking voltage may also be lower.

The edge region 120 has a first semiconductor zone 121 of a first conduction type. Optionally, the first semiconductor zone 121 may be a sub-region of the first main semiconductor region 11 and accordingly have the conduction type of the first main semiconductor region 11. In the present embodiment, the first conduction type is "n". Alternatively, the first conduction type could also be "p".

In the edge region 120 there is also an edge termination structure with at least N field limiting structures 50. N is an integer with N≥1. For instance, N may be at least 3 or at least 5 or at least 10 or at least 15. Each of the field limiting structures 50 has a field ring 10, and a separation trench 20 formed in the semiconductor body 100. Each of the field rings 10 has a second conduction type (here: p) complementary to the first conduction type (here: n) and forms a pn-junction 25 with the first semiconductor zone 121. Further, each of the field rings 10 surrounds the active semiconductor region 110. For each of the field limiting structures 50, the separation trench 20 of that field limiting structure 50 is arranged between the field ring 10 of the respective field limiting structure 50 and the active semiconductor region 110. Optionally, between any two of the field rings 10 of the semiconductor device 1, at least one of the separation trenches 20 may be arranged. Also optionally, one, more than one or each of the separation trenches 20 may extend from the top side 101 towards the bottom side 102 into the semiconductor body 100. It is also possible, that one, more than one or each of the field limiting structures 50 includes more than one separation trench 20.

One, more than one or each of the separation trenches 20 may be partly or completely filled with at least one of: a dielectric; polycrystalline semiconductor material. Suitable dielectrics are, for instance, silicon oxide, silicon nitride, high-k material, or other dielectric materials that are solid at room temperature (20° C.). Suitable polycrystalline semiconductor material may be undoped or doped.

The field rings 10 may have an equidistant or a non-equidistant spacing. In the latter case which is illustrated in FIG. 2 and considering all field rings 10 of the semiconductor device 1, the distances d10 between adjacent field rings 10 may increase from the active semiconductor region 120 towards the lateral surface 103. The lateral widths of the field rings 10 may be equal as in FIG. 2, or unequal. Optionally, the distance d10 between a first one of the field rings 10 and a second one of the field rings 10 with no further field ring 10 arranged in between may be at least 1 µm and/or less than or equal to 30 µm.

Alternatively or in addition, for each pair of a first one of the field rings 10 and a second one of the field rings 10 with no further field ring arranged between the first one of the field rings 10 and the second one of the field rings 10, the distance d10 between the first one of the field rings 10 and the second one of the field rings 10 may be at least 1 µm and/or less than or equal to 20 µm.

Also optionally, one, more than one or all field limiting structures 50 may have an electrically conductive field plate 30 that is arranged on the top side 101 and electrically connected to the field ring 10 of the respective field limiting structure 50. Thereby, a dielectric 61 is arranged between the field plate 30 and the top side 101. A protrusion of the field plate 30 extends toward and electrically contacts the respective field ring 10. Further, a passivation layer 62, for instance an imide, may be arranged on the top side 101 such that the field plates 30 are arranged between the passivation layer 62 and the top side 101. Regardless of whether a field ring 10 is electrically connected to a field plate 30 or not, the field ring 10 may be floating.

As illustrated in FIG. 2, for one, more than one or all field limiting structures 50 of the semiconductor device 1, the field ring 10 of the respective field limiting structure 50 may directly abut on the separation trench 20 of the respective field limiting structure 50.

Alternatively or in addition, for one or more than one or each of the field limiting structures 50, the pn-junction 25 of that field limiting structure 50 may terminate at the bottom of the separation trench 20 of that field limiting structure 50 which is illustrated in FIG. 3.

Also alternatively or in addition, for one or more than one or each of the field limiting structures 50, the pn-junction 25 of that field limiting structure 50 may terminate at a side wall of the separation trench 20 of that field limiting structure 50 which is illustrated in FIG. 4.

Again alternatively or in addition, as illustrated in FIG. 5, for one, more than one or all field limiting structures 50 of the semiconductor device 1, the field ring 10 of the respective field limiting structure 50 may be spaced distant from the separation trench 20 of the respective field limiting structure 50. Further, it is also possible that for one or some of field limiting structures 50 of the semiconductor device 1, the field ring 10 of the respective field limiting structure 50 directly abuts on the separation trench 20 of the respective field limiting structure 50, and that for one or some other of the field limiting structures, the field ring 10 of the respective field limiting structure 50 is be spaced distant from the separation trench 20 of the respective field limiting structure 50.

For the rest, the semiconductor devices 1 of FIGS. 3, 4 and 5 may have the same features as the semiconductor device 1 described with reference to FIG. 2.

FIG. 6 shows an enlarged section B of the semiconductor device 1 of FIG. 2, and FIG. 7 an enlarged section C of the semiconductor device 1 of FIG. 5. One, more than one or all separation trenches 20 of the semiconductor device 1 as described with reference to the previous Figures may be partly or completely filled with a dielectric 21, for instance a silicon oxide or any other suitable dielectric. Optionally, the dielectric may have a relative dielectric constant $\in_r$ greater than the relative dielectric constant of thermal silicon oxide (3.9), e.g. a dielectric constant $\in_r$ of at least 4 or even of at least 7.

As further illustrated in FIGS. 8 and 9, the surfaces of one, more than one or each of the separation trenches 20 may be coated with a layer made of a dielectric material 211 and further be filled with an electrically conductive material 212 so that the electrically conductive material 212 does not directly contact the semiconductor body 100. The dielectric material 211 may also be one of the dielectric materials 21 described above with reference to FIGS. 6 and 7. A suitable electrically conductive material 22 is, for instance, metal, or doped or undoped polycrystalline semiconductor material, e.g. polycrystalline silicon.

The arrangement described with reference to FIG. 8 differs from the arrangements described with reference to FIGS. 2 and 6 only in that there also is an electrically conductive filling 212 arranged in the separation trenches 20. The separation trenches 20 also directly adjoin the respective field ring 10. Accordingly, the arrangement described with reference to FIG. 9 differs from the arrangements described with reference to FIGS. 3 and 7 only in that there also is an electrically conductive filling 212 arranged in the separation trenches 20. The separation trenches 20 are also spaced distant from the respective field ring 10.

As explained above, the distance d1 between a separation trench 20 and the field ring 10 of the respective field limiting structure 50 may be zero (FIGS. 2, 3, 4, 6 and 8), or greater than zero (FIGS. 4, 7 and 9).

In general, for one, more than one or each of the field limiting structures 50 of the semiconductor device 1 the distance d1 between the field ring 10 of the field limiting structure 50 and the separation trench 20 of that same field limiting structure 50 may be less than or equal to 3 μm.

If a semiconductor device 1 has at least one field limiting structure 50 with the separation trench 20 being spaced distant from the field ring 10 (i.e. d1>0), a section of the first semiconductor zone 121 may be arranged between that field ring 10 and that separation trench 20. Thereby, the section of the first semiconductor zone 121 may extend as far as the top side 101.

According to the definitions above, the distance d1 is to be taken between a separation trench 20 and the next one of all field rings 10 of the semiconductor device 1 that surrounds the separation trench 20. In the same manner, a distance d2 may be defined to be the distance between that separation trench 20 and the next one of all field rings 10 of the semiconductor device 1 that is surrounded by the separation trench 20.

When investigating the effect of the separation trenches 20 it surprisingly turned out that it is advantageous to choose the distance d2 between a separation trench 20 and the nearest field ring 10 the separation trench 20 surrounds to be greater than the distance d1 between that separation trench 20 and the nearest field ring 10 that surrounds that separation trench 20. In other words, if there is a separation trench 20 arranged between a first one of the field rings 10 and a second one of the field rings 10 with no further field ring arranged between the first one of the field rings 10 and the second one of the field rings 10, and if the second one of the field rings 10 is arranged between the active semiconductor region 110 and the first one of the field rings 10 (i.e. the first one of the field rings 10 surrounds the second one of the field rings 10), the ratio between a first distance d1 between the separation trench 20 and the first one of the field rings 10 and a second distance d2 between the separation trench 20 and the second one of the field rings 10 is less than 0.5 or less than 0.2 or even less than 0.01. The same criterion may apply to more than one or even all separation trenches 20 of the semiconductor device 1.

In all embodiments of the invention, for a pair of field rings with a first field ring 10 and a second field ring 10 surrounding the first field ring 10 with no further field ring 10 arranged between the first field ring 10 and the second field ring 10, there may be one and only one separation trench 20 arranged between the first field ring 10 and the second field ring 10. This criterion may apply to one, more than one or each pair of adjacent field rings 10.

Figure 10A:
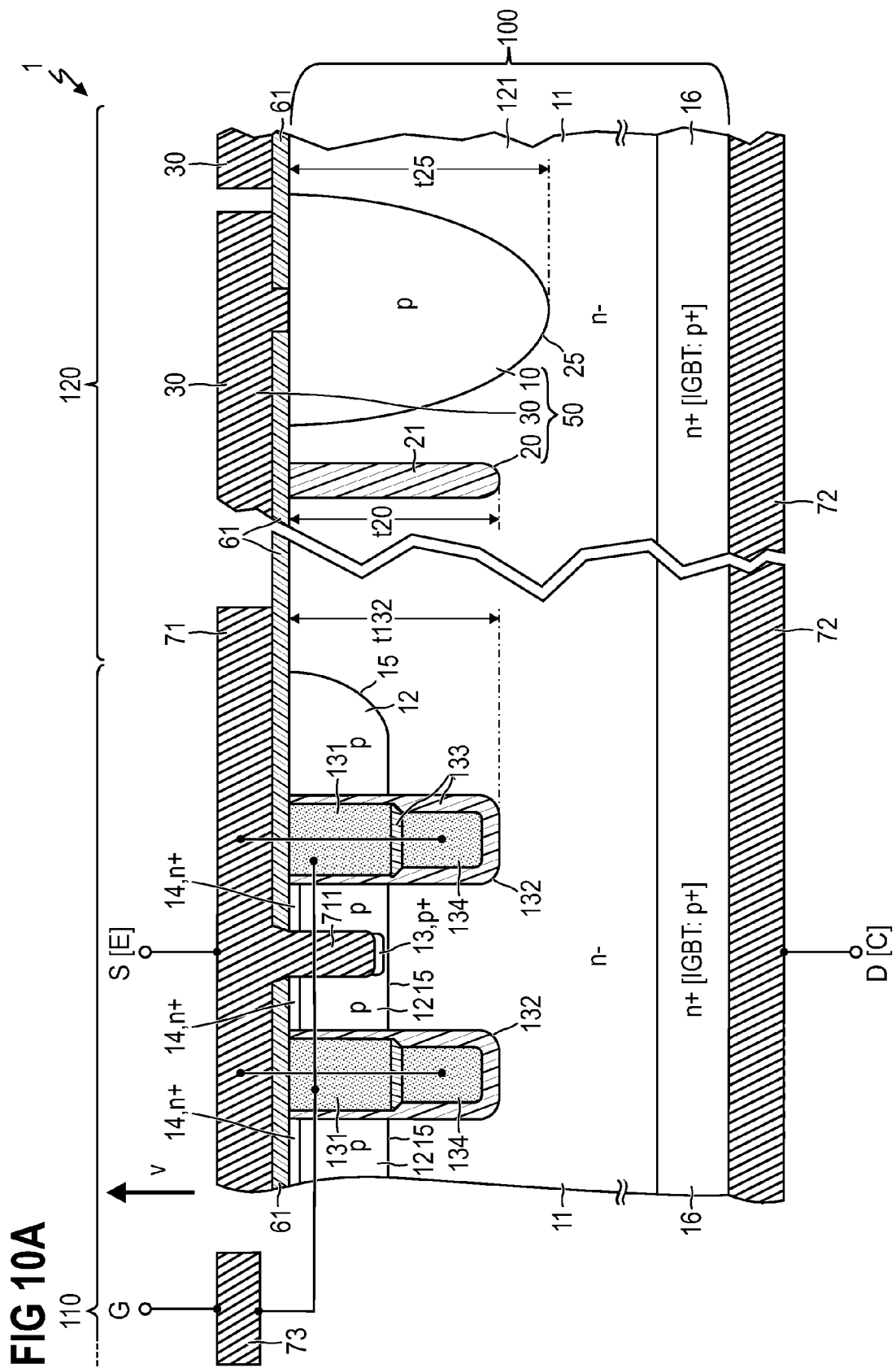
FIG. 10A illustrates a cross-sectional side view of a semiconductor device having a gate electrode arranged in a gate trench that is formed in the semiconductor body, wherein the gate trench and the isolation trench were formed simultaneously in a common etching step.

In particular if the semiconductor device 1 is a gate-controllable semiconductor device with one or more gate electrodes each arranged in a gate electrode trench formed in the semiconductor body 100, the gate electrode trenches and the separation trenches 20 may be produced simultaneously in a common etching step. FIG. 10A shows a section of a semiconductor device 1 having a cell structure with a number of transistor cells formed in the active semiconductor region 120.

In the active semiconductor region 120, the semiconductor body 100 has a drift region 11 of the first conduction type, a body region 12 of the second conduction type, a body contact region 13 having also the second conduction type but a doping concentration higher than the body region 12, and a source region 14 having the first conduction type but a doping concentration higher than the drift region 11. The main pn-junction 15 is formed between the drift region 11 and the body region 12. A further semiconductor region 16 is arranged on that side of the drift zone 11 facing away from the top side 101. In case of an IGBT, the further semiconductor region 16 is collector region having the second conduction type and in case of a MOSFET the further semiconductor region 16 is a drain region having the first conduction type. In both cases, the doping concentration of the further semiconductor region is greater than that of the drift zone 11.

As far as a semiconductor device 1 described herein is a gate controllable transistor, the doping concentrations of the collector or drain region 16 and of the source or emitter region 14 may be, for instance, in a range of between $10^{19}$ cm$^{-3}$ and $10^{21}$ cm$^{-3}$. The doping concentration of the drift region 11 may be, for instance, in a range of between $10^{13}$ cm$^{-3}$ and $2 \cdot 10^{17}$ cm$^{-3}$, and the doping concentration of the body region 12 may be, for instance, in a range of between $10^{16}$ cm$^{-3}$ and $10^{18}$ cm$^{-3}$.

Each transistor cell has a gate electrode 131 arranged in a gate electrode trench 132 that is formed in the semiconductor body 100. The gate electrodes 131 are electrically interconnected and further electrically connected to a gate control electrode 73. The gate electrode 73 is arranged on the semiconductor body 100 in a conventional manner.

Optionally, in each of the gate electrode trenches 132 there may be a field electrode 134 arranged between the bottom side 102 and the gate electrode 131 arranged in the same gate electrode trench 132. The field electrodes 134 are electrically interconnected and further electrically connected to a common first main electrode 71 which is a source electrode S if the semiconductor device 1 is a MOSFET or an emitter electrode E if the semiconductor device 1 is an IGBT. The first main electrode 71 may be arranged on the top side 101 with a dielectric layer 61 arranged between the first main electrode 71 and the top side 101. A protrusion 711 of the first main electrode 71 penetrates the dielectric layer 61 and protrudes into the semiconductor body 100 where it electrically contacts the body contact region 13. A second main electrode 72 may be arranged on the bottom side 102 where it electrically contacts the further semiconductor region 16. The second main electrode 72 is a drain electrode D in case of a MOSEFT or a collector electrode C in case of an IGBT.

In each of the gate electrode trenches 132, a gate trench dielectric 133 electrically insulates the respective gate electrode 131 from the semiconductor body 100. If there is also a field electrode 134 arranged in the trench, the gate trench dielectric 133 prevents the field electrode 134 from directly contacting the semiconductor body 100. It is to be noted that the gate trench dielectric 133 may be produced in different subsequent steps and therefore be composed of different sections.

Figure 10B:
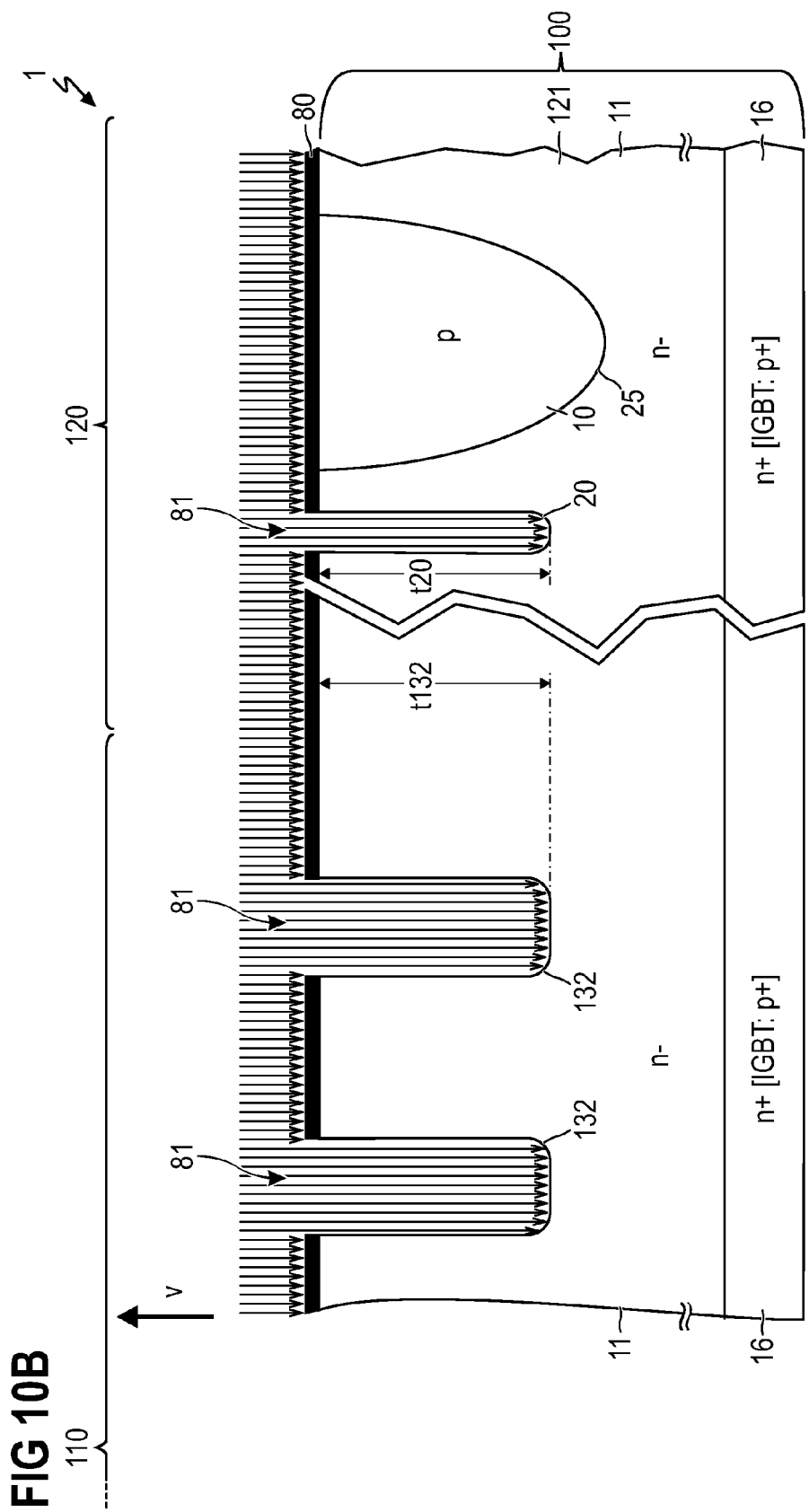
FIG. 10B illustrates the cross-sectional side view of the semiconductor device of FIG. 10A during the common etching step.

According to one aspect of the invention, the separation trenches 20 and the gate electrode trenches 132 may be used simultaneously in a common etching step that is schematically illustrated in FIG. 10B which shows the semiconductor device 1 of FIG. 10A during its production. As can be seen from FIG. 10B, a mask layer 80 having openings 81 is arranged on the top side. The mask layer 80 is used for etching the gate electrode trenches 132 and the separation trenches 20 simultaneously in a common etching step. As illustrated by arrows, the etching method may be an anisotropic etching method, for instance RIE (reactive ion etching). Due to the common etching step, the depths t132 of the gate electrode trenches 132 and the depths t20 of the separation trenches 20 are identical or almost identical. Different depths may occur if there is a greater variance between the widths of the gate electrode trenches 132 and the widths of the separation trenches 20 (i.e. between the widths of the openings 81 for etching the gate electrode trenches 132 and the widths of the openings 81 for etching the separation trenches 20). In a gate controllable transistor device of the present invention, the depth t132 of the gate electrode trench 132 of a field limiting structure 50 may be from 0.70 times to 1.30 times the depth t20 of the separation trench 20 of that field limiting structure 50. This criterion may apply to one, more than one or all field limiting structures 50 of the semiconductor device 1.

As also illustrated in FIGS. 10A and 10B, the pn-junction 25 between a field ring 10 and the first semiconductor zone 121 extends from the top side 101 into the semiconductor body 100 to a maximum depth t25. Optionally, the maximum depth t25 of the pn-junction 25 of a field limiting structure 50 may be at least 0.1 times and/or less than 3 times the depth t20 of the separation trench 20 of that field limiting structure 50. This criterion may apply to one, more than one or all field limiting structures 50 of the semiconductor device 1. Further, this criterion may apply not only to transistors but to any semiconductor device 1 of the present invention.

In respect of the different depths t20, t25 and t132 mentioned in the present specification it is to be noted that all those depths are to be measured relative to the top side 101.

Figure 11:
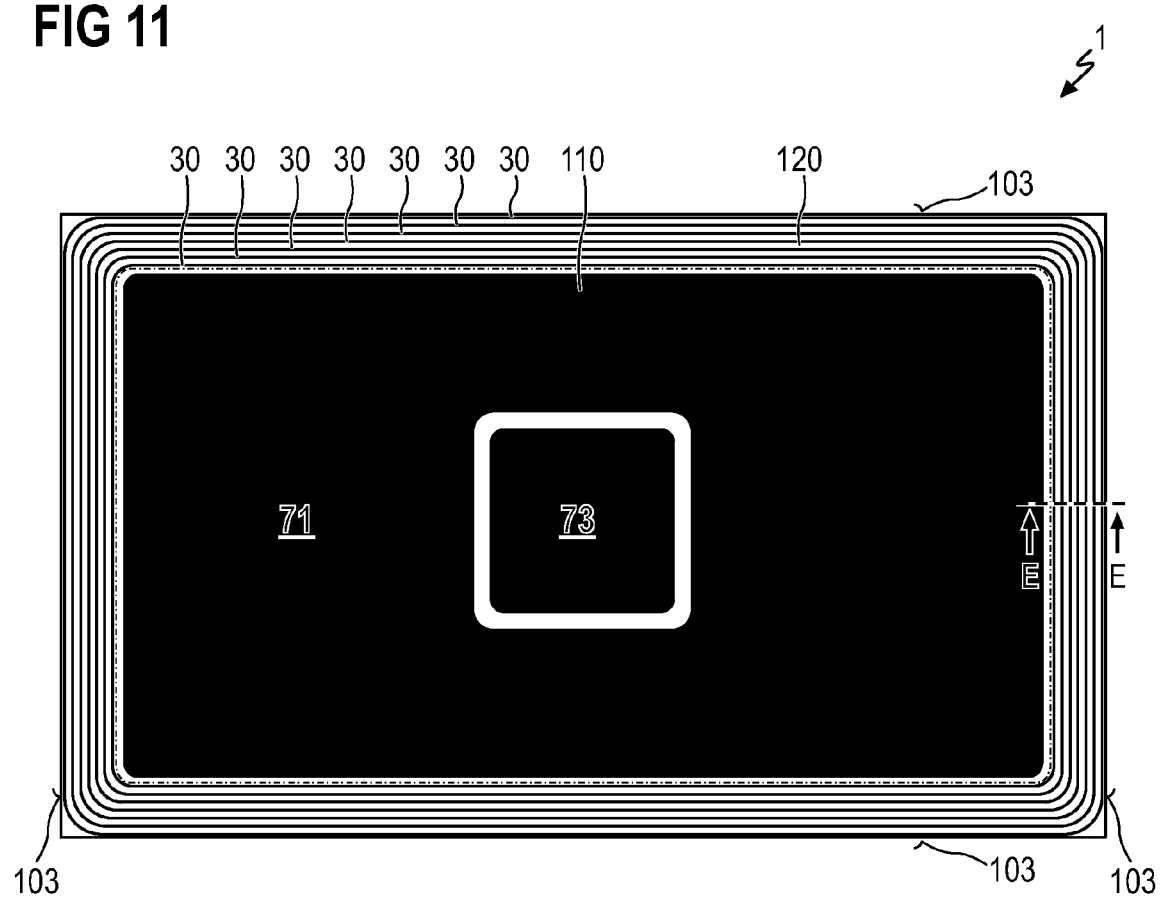
FIG. 11 is a top view of a semiconductor device according to FIG. 1B illustrating also the electrodes arranged on the top side of the semiconductor body.

FIG. 11 is a top view of a semiconductor device 1 according to FIG. 1B that is embodied as a gate controllable semiconductor device and that may optionally have a structure as described with reference to the previous Figures. FIG. 11 shows the first main electrode 71 that is arranged above the active semiconductor region 110 on the top side 101, the gate electrode 73 arranged on the top side 101, and several field plates 30 surrounding both the first main electrode 71 and the gate electrode 73 and also arranged on the top side 101.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Expressions like "subsequently", "then", "following" etc. used in the above specification are only intended to express that a certain step is carried out later than a previous step. Nevertheless, one or more additional steps may be carried out after the previous step and prior to the certain step.

What is claimed is:

1. A semiconductor device, comprising:
a semiconductor body comprising a bottom side, a top side opposite the bottom side, and a lateral surface;
an active semiconductor region formed in the semiconductor body;
an edge region surrounding the active semiconductor region;
a first semiconductor zone formed in the edge region, the first semiconductor zone having a first conduction type; and
an edge termination structure formed in the edge region and comprising at least N field limiting structures, each of the field limiting structures comprising a field ring, and a separation trench formed in the semiconductor body, wherein:
N≥2;
each of the field rings has a second conduction type complementary to the first conduction type and forms a pn-junction with the first semiconductor zone;
each of the field rings surrounds the active semiconductor region; and
for each of the field limiting structures, the separation trench of that field limiting structure is arranged between the field ring of that field limiting structure and the active semiconductor region, wherein
one of the separation trenches is arranged between a first one of the field rings and a second one of the field rings, wherein there is no further field ring arranged between the first one of the field rings and the second one of the field rings;
the first field ring surrounds the one of the separation trenches and the one of the separation trenches surrounds the second field ring; and
a distance between the one of the separation trenches and the first field ring is less than a distance between the one of the separation trenches and the second field ring.

2. The semiconductor device of claim 1, wherein for each of the field limiting structures, the field ring of that field limiting structure surrounds the separation trench of that same field limiting structure.

3. The semiconductor device of claim 1, wherein one, more than one or each of the separation trenches extends from the top side into the semiconductor body.

4. The semiconductor device of claim 1, wherein one, more than one or each of the separation trenches is filled with at least one of:
a dielectric; and
polycrystalline semiconductor material.

5. The semiconductor device of claim 1, wherein for one, more than one or each of the field limiting structures, the field ring of that field limiting structure directly abuts the separation trench of that same field limiting structure.

6. The semiconductor device of claim 1, wherein at least one of the following features apply:
for one, more than one or each of the field limiting structures, the field ring of the field limiting structure is spaced distant from the separation trench of that same field limiting structure;

for one, more than one or each of the field limiting structures, the pn-junction formed between the first semiconductor zone and the field ring of that field limiting structure terminates at the bottom of the separation trench of that same field limiting structure; and for one, more than one or each of the field limiting structures, the pn-junction formed between the first semiconductor zone and the field ring of that field limiting structure terminates at a side wall of the separation trench of that same field limiting structure.

7. The semiconductor device of claim 1, wherein for one, more than one or each of the field limiting structures, a distance between the field ring of that field limiting structure and the separation trench of that same field limiting structure is less than 3 µm.

8. The semiconductor device of claim 1, wherein a distance between the first one of the field rings and the second one of the field rings with no further field ring arranged between the first one of the field rings and the second one of the field rings is at least one of:
at least 1 µm; and
less than or equal to 30 µm.

9. The semiconductor device of claim 1, wherein for each pair of the first one of the field rings and the second one of the field rings with no further field ring arranged between the first one of the field rings and the second one of the field rings, a distance between the first one of the field rings and the second one of the field rings is less than or equal to 20 µm.

10. The semiconductor device of claim 1, wherein for one, more than one or each of the field limiting structures:
the field ring of that field limiting structure is spaced distant from the separation trench of that same field limiting structure; and
a section of the first semiconductor zone is arranged between the field ring and the separation trench of that same field limiting structure.

11. The semiconductor device of claim 1, wherein:
a ratio between a first distance between the one of the separation trenches and the first one of the field rings and a second distance between the one of the separation trenches and the second one of the field rings is less than 0.5.

12. The semiconductor device of claim 1, wherein for one, more than one or all field limiting structures, the pn-junction of the field ring of that field limiting structure and the first semiconductor zone has a maximum junction depth and the separation trench of that field limiting structure has a trench depth, and wherein at least one of the following applies:
the maximum junction depth is at least 0.1 times the trench depth; and
the maximum junction depth is less than 3 times the trench depth.

13. The semiconductor device of claim 1, wherein N is at least 3, at least 5, at least 10 or at least 15.

14. The semiconductor device of claim 1, wherein one, more than one or each of the separation trenches is filled with at least one of:
a dielectric; and
a metal or a polycrystalline semiconductor material.

15. The semiconductor device of claim 1, wherein one, more than one or each of the field rings is floating.

16. The semiconductor device of claim 1, wherein one, more than one or each of the field limiting structures comprises an electrically conductive field plate arranged on the top side and electrically connected to the field ring of the same field limiting structure.

17. The semiconductor device of claim 1, wherein one, more than one or each of the field limiting structures comprises an electrically conductive field plate arranged on the top side and electrically isolated from the field ring of the same field limiting structure.

18. The semiconductor device of claim 1, wherein the semiconductor device is one of an IGFET (Insulated Gate Field Effect Transistor), a MOSFET (Metal Oxide Field Effect Transistor), an IGBT (Insulated Gate Bipolar Transistor), a JFET (Junction Field Effect Transistor) or a HEMT (High Electron Mobility Transistor), a thyristor, a BJT (bipolar junction transistor) or a diode.

19. The semiconductor device of claim 1, wherein:
the semiconductor device is a gate-controllable semiconductor device comprising at least one gate electrode;
each gate electrode is arranged in a gate electrode trench formed in the active transistor region; and
a depth of the gate electrode trench is 0.70 times to 1.30 times a depth of the separation trenches.

20. The semiconductor device of claim 1, wherein the semiconductor device comprises a blocking voltage capability of at least 10 V or at least 100 V or at least 600 V or at least 1200 V or at least 3.3 kV.

21. The semiconductor device of claim 1, further comprising:
a first main electrode;
a second main electrode;
a load path between the first main electrode and the second main electrode in the active semiconductor region; and
a control electrode for controlling an electric current through the load path.

22. A method for producing a semiconductor device, the method comprising:
providing a semiconductor body comprising a bottom side, a top side opposite the bottom side, and a lateral surface;
producing an active semiconductor region in the semiconductor body;
producing an edge region surrounding the active semiconductor region, and such that the edge region comprises a first semiconductor zone having a first conduction type; and
producing at least N field limiting structures in the edge region such that each of the field limiting structures comprises both a field ring and a separation trench formed in the semiconductor body, wherein:
N≥2;
each of the field rings has a second conduction type opposite the first conduction type and forms a pn-junction with the first semiconductor zone; and
each of the field rings surrounds the active semiconductor region;
for each of the field limiting structures, the separation trench of that field limiting structure is arranged between the field ring of that field limiting structure and the active semiconductor region, wherein
one of the separation trenches is arranged between a first one of the field rings and a second one of the field rings, wherein there is no further field ring arranged between the first one of the field rings and the second one of the field rings;
the first field ring surrounds the one of the separation trenches and the one of the separation trenches surrounds the second field ring; and
the distance between the one of the separation trenches and the first field ring is less than the distance between the one of the separation trenches and the second field ring.

23. The method of claim 22, wherein:
the semiconductor device is a gate controllable semiconductor device comprising at least one gate electrode, each gate electrode being arranged in a gate electrode trench formed in the active transistor region; and
each of the gate electrode trenches and each of the separation trenches are produced simultaneously in a common etching step.

24. The method of claim 23, wherein after the etching step is finished, a depth of the gate electrode trenches is 0.70 times to 1.30 times a depth of the of the separation trenches.

* * * * *